United States Patent

Shaffstall et al.

[15] 3,646,587

[45] Feb. 29, 1972

[54] DIGITAL-TO-ANALOG CONVERTER USING FIELD EFFECT TRANSISTOR SWITCH RESISTORS

[72] Inventors: Everett L. Shaffstall, Fountain Valley; Carroll R. Perkins, Balboa Island; James L. Gundersen, Carson, all of Calif.

[73] Assignee: Hughes Aircraft Company, Culver City, Calif.

[22] Filed: Dec. 16, 1969

[21] Appl. No.: 885,518

[52] U.S. Cl. ..........................340/347 DA, 307/205, 307/251

[51] Int. Cl. ..........................H03k 13/06

[58] Field of Search ............340/347, 347 DA; 307/251, 242, 307/243, 279, 304, 205; 317/235

[56] References Cited

UNITED STATES PATENTS

| | | | |
|---|---|---|---|
| 2,954,551 | 9/1960 | Doucette et al. | 340/347 |
| 2,993,202 | 7/1961 | Halonen | 340/347 |
| 3,184,734 | 5/1965 | Uren et al. | 340/347 |
| 3,273,143 | 9/1966 | Wasserman | 340/347 |
| 3,305,857 | 2/1967 | Barber | 340/347 |
| 3,307,173 | 2/1967 | Popodi et al. | 340/347 |
| 3,328,792 | 6/1967 | Stone et al. | 340/347 |

OTHER PUBLICATIONS

R. M. Warner, Jr. et al. " Bell Telephone System" Monograph 3087, " A Semiconductor Current Limiter" 1959

Hoeschele, Analog- to- Digital/Digital- to- Analog Conversion Techniques, John Wiley & Sons, New York, 1968 (Aug. 14) Pg. 180 & pp. 182- 194 relied on.

*Primary Examiner*—Maynard R. Wilbur
*Assistant Examiner*—Charles D. Miller
*Attorney*—James K. Haskell and Paul M. Coble

[57] ABSTRACT

A plurality of field effect transistors having their source-drain paths connected in parallel are operated as switch resistors under the control of respective digital input bit signals. When biased to conduction with a gate voltage at a uniform first preselected level, each switch resistor provides in its source-drain path a resistance $R_n=2^{(n-1)}R$, where $R$ is a predetermined resistance and $n$ is a positive integer identifying the switch resistor in question. When biased with a gate voltage at a uniform second preselected level, each switch resistor is nonconductive. A plurality of gating field effect transistors selectively apply to the respective switch resistor gate electrodes respective voltages at essentially either the first or the second aforementioned preselected level as determined by the respective digital input bit signals. Output circuitry including an operational amplifier provides an analog voltage representative of the net current flow through the switch resistor source-drain paths.

4 Claims, 1 Drawing Figure

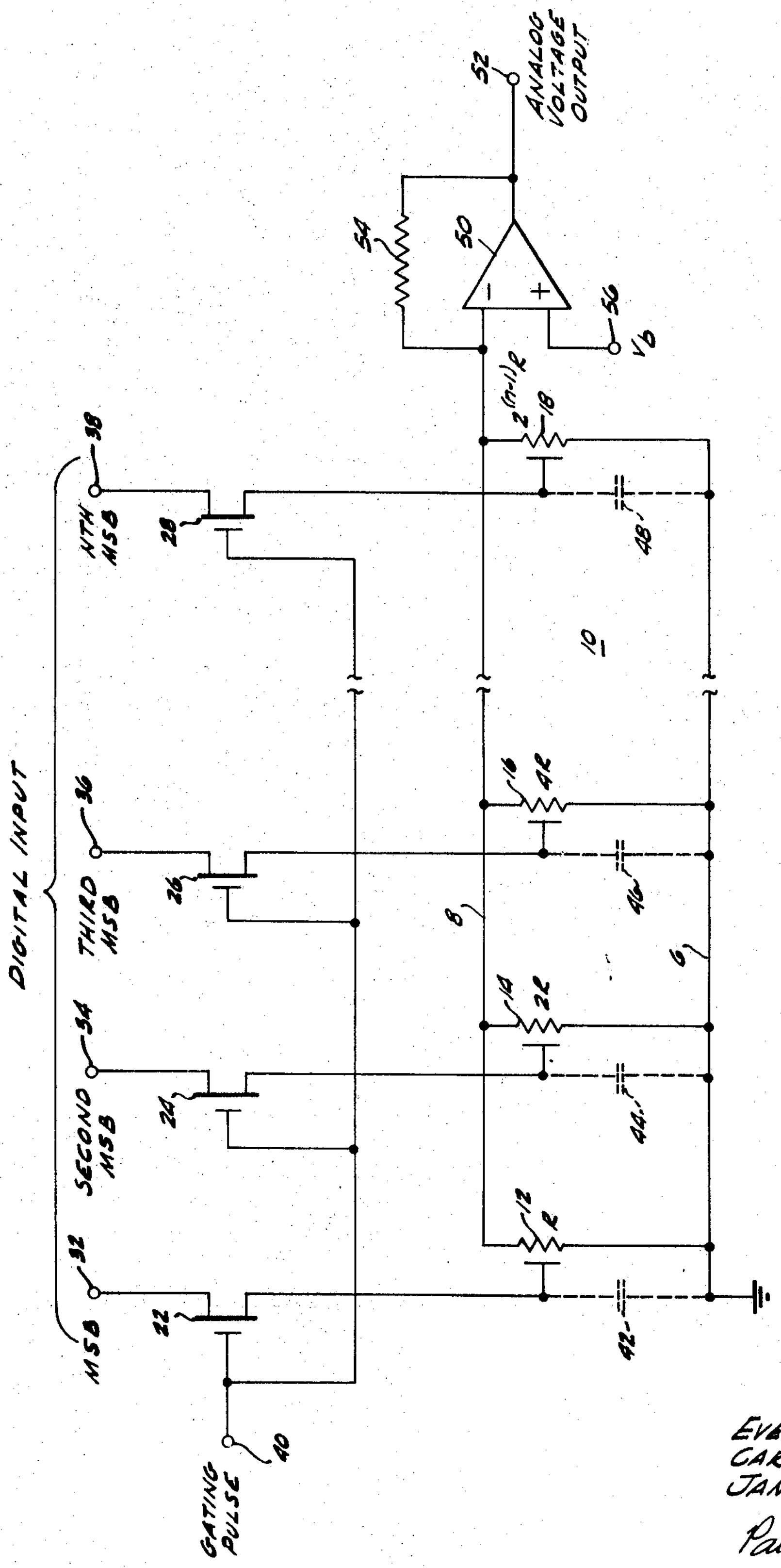
INVENTORS.
EVERETT L. SHAFFSTALL,
CARROLL R. PERKINS,
JAMES L. GUNDERSEN,
Paul M. Coble
ATTORNEY.

DIGITAL-TO-ANALOG CONVERTER USING FIELD EFFECT TRANSISTOR SWITCH RESISTORS

This invention relates to electronic circuits, and more particularly relates to a digital-to-analog converter circuit using field effect transistors for transforming digital information into an analog current or voltage.

Recent advances in microelectronics, including the development of MOS (metal-oxide-semiconductor) devices, have led to new approaches to the design and fabrication of various types of electronic circuits. Specifically, it is often desired to fabricate a complete integrated circuit, system or subsystem on a single semiconductor substrate, as well as to be able to drive the circuit or system components with voltage levels provided by integrated circuit logic.

Accordingly, it is an object of the present invention to provide a digital-to-analog converter circuit which is more compatible with integrated electronic circuitry than has been achieved in the prior art.

It is a further object of the present invention to provide a digital-to-analog converter which may be formed on a single semiconductor substrate, or even on only a small portion of such a substrate, and which circuit is readily operable with voltage levels provided by integrated circuit logic.

It is a still further object of the invention to provide a digital-to-analog converter circuit of extremely small size and weight, and which circuit is also relatively insensitive to wide temperature variations.

In accordance with the foregoing objects a digital-to-analog converter according to the invention includes a plurality of field effect transistors operated as switch resistors and having their respective current paths connected in parallel. When a voltage essentially at a uniform first preselected level is applied to the respective control electrodes of the switch resistors, each switch resistor is conductive of current such that a resistance R is provided in the current path of one switch resistor and a different resistance related to the resistance R in accordance with a preselected mathematical relationship is provided in the current path of each other switch resistor. When a voltage essentially at a uniform second preselected level is applied to the respective switch resistor control electrodes, each switch resistor is essentially nonconductive of current. Gating circuitry receives digital input signals and, upon the occurrence of a gating signal, selectively applies to the respective control electrodes of the switch resistors a voltage it essentially either the first or the second aforementioned preselected level as determined by the digital input signals. Output circuitry coupled to the current paths of the switch resistors provides an analog signal representative of the net current flow through these current paths.

Additional objects, advantages, and characteristic features of the present invention will become apparent from the following detailed description of the invention when considered in conjunction with the accompanying drawing in which the sole FIGURE is a schematic circuit diagram illustrating a digital-to-analog converter circuit in accordance with a preferred embodiment of the invention.

Referring to the FIGURE with greater particularity, a digital-to-analog converter according to the invention utilizes a resistive ladder network 10 having a plurality of weighted resistive devices adapted to be selectively effectively connected or disconnected in parallel between a pair of conductors 6 and 8. Conductor 6 is connected to a level of reference potential such as ground, while conductor 8 is connected to analog output signal furnishing circuitry for the converter. Each resistive device consists of a field effect transistor operated as a switch resistor. As shown in the FIGURE, a plurality of field effect transistor switch resistors 12, 14, 16 and 18 have their source-drain paths connected in parallel between the conductors 6 and 8. It is pointed out that although four such resistive devices are shown, this number is purely illustrative, the number of resistive devices to be employed in a particular converter being equal to the number of bits in the digital input words to the converter.

The first field effect transistor switch resistor 12, which is associated with the most significant bit (MSB) of the digital input word, is designed so that when this transistor is biased to conduction at a predetermined operating point in the linear region of its voltage-current characteristic, the source-drain path of transistor 12 provides a predetermined resistance R. The second field effect transistor switch resistor 14, which is associated with the second most significant bit of the digital input work, is designed so that when the transistor 14 is biased to conduction with a gate voltage equal to the gate voltage which biases the transistor 12 to the aforementioned operating point, the source-drain path of the transistor 14 provides a resistance related to the aforementioned resistance R in accordance with a preselected mathematical relationship.

In the preferred embodiment of the invention illustrated in the FIGURE, in which the digital-to-analog converter is designed to convert a binary coded digital work into an analog current or voltage proportional to the numerical value of the digital word, the preselected mathematical relationship is a power of two relationship. Using this relationship, when the transistor 14 is biased to conduction with a gate voltage equal to the gate voltage which biases the transistor 12 to the aforementioned operating point, the source-drain path of transistor 14 would provide a resistance of 2R. This resistance value may be achieved by designing the transistor 14 with a channel width-to-length ratio one-half that of the field effect transistor 12. Similarly, the third field effect transistor switch resistor 16, which is associated with the third most significant bit of the digital input word, would be designed with a channel width-to-length ratio one-fourth that of the transistor 12 so that when the transistor 16 is biases to conduction with a gate voltage equal to that which biases the transistor 12 to the aforementioned operating point, the source-drain path of the transistor 16 would provide a resistance of 4R. The nth field effect transistor switch resistor 18, which is associated with the nth most significant bit of the digital input word, would be designed with a channel width-to-length ratio $\frac{1}{2}^{(n-1)}$ that of the first transistor 12 so that when the $n$th transistor is biased to conduction with the aforementioned gate voltage, the $n$th transistor 18 would provide in its source-drain path a resistance of $2^{(n-1)}$R.

It is pointed out that although in a preferred embodiment of the invention the respective ladder network resistances are weighted in accordance with a power of two relationship, any preselected mathematical relationship may be employed for these resistances with the principles of the invention. As a further example, when the first field effect transistor 12 provides a resistance R, the second field effect transistor 14 may be designed to provide a resistance of $R^2$, the third transistor 16 a resistance of $R^3$, and the $n$th transistor 18 a resistance of $R^n$. The desired resistance relationship may be achieved by designing the field effect transistor switch resistors 14, 16 and 18 with a channel width-to-length ratio inversely related to that of the switch resistor 12 in accordance with the selected mathematical relationship.

The field effect transistor switch resistors 12, 14, 16 and 18 are selectively effectively connected and disconnected into the ladder network 10 by means of respective gating devices 22, 24, 26 and 28. In a preferred embodiment of the invention, the gating devices 22, 24, 26 and 28 are field effect transistors having their respective source-drain paths connected between respective gate electrodes of switch resistors 12, 14, 16 and 18 and respective terminals 32, 34 36 and 38 adapted to receive respective signals indicative of the first, second third and nth most significant bits of a digital input words. The respective bit signals may be obtained from respective stages of a storage register, for example.

In exemplary logic which may be used with the described digital-to-analog converter, a digital "0" is represented by zero volts, while a digital "1" is represented by a voltage level of −v, which may be −7 volts, for example. It is pointed out, however, that since uniform gate voltages are needed for the respective switch resistors 12, 14, 16 and 18 in order to insure that the desired relative resistance values will be achieved in their respective source-drain paths when the switch resistors are conductive of current, the input digital voltage level −V applied to the terminals 32, 34, 36 and 38 should be highly regulated.

In order to apply the digital bit signals at terminals 32, 34, 36 and 38 to the respective gate electrodes of switch resistors 12, 14, 16 and 18 at the desired time, the gating field effect transistors 22, 24, 26 and 28 are rendered conductive by a common gating signal received at terminal 40 and applied to the gate electrode of each of the gating transistors 22, 24, 26 and 28. When the aforementioned exemplary values of zero volts and −7 volts are used for the digital signal levels, a gating pulse of −13 volts may be employed. The voltage levels applied to the respective gate electrodes of the switch resistors 12, 14, 16 and 18 upon the occurrence of a gating signal at terminal 40 are retained at the respective gate electrodes until the occurrence of the next gating signal due to the inherent, or parasitic, gate input capacitance of the switch resistors 12, 14, 16 and 18. This capacitance is represented by respective capacitors 42, 44, 46 and 48 shown in dashed lines as connected between the respective gate electrodes of switch resistors 12, 14, 16 and 18 and ground.

Analog output current of a magnitude proportional to the numerical value of the digital input word is furnished on the lead 8, and this current may be measured by an ammeter or other appropriate current sensing device. However, in the preferred embodiment of the invention illustrated in the FIGURE, an analog output voltage is provided by connecting the lead 8 to the inverting input terminal of an operational amplifier 50 having its output terminal connected to a terminal 52 from which the analog output voltage may be obtained. A feedback resistor 54 is connected between the operational amplifier inverting input terminal and output terminal 52, while the noninverting input terminal of operational amplifier 50 is connected to a power supply terminal 56 which furnishes a voltage $V_b$. The voltage $V_b$ functions as a bias voltage for the ladder network 10 because the voltage at the inverting input terminal of the operational amplifier 50 i.e., the voltage on the lead 8) is constrained by the operational amplifier feedback loop to be essentially equal to the voltage at the noninverting input terminal 56. The bias voltage $V_b$ is selected to insure that when the switch resistors 12, 14, 16 and 18 are conductive of current, they are operating in a linear region of their voltage-current characteristic. For a gate voltage level representative of a digital "1"), and for a switch resistor threshold voltage (between conduction and nonconduction) of −2 volts, a ladder bias voltage $V_b$ of −2 volts may be used.

In the operation of the described digital-to-analog converter, in the absence of a gating signal at terminal 40, each of the gating field effect transistors 22, 24, 26 and 28 is biased to a nonconductive condition regardless of whether the voltage applied to the digital input terminals 32, 34, 36 and 38 is representative of a digital "1" or a digital "0." When a gating pulse is present at terminal 40, each of the gating field effect transistors 22, 24, 26 and 28 is rendered conductive of current to essentially saturation, and the voltage levels at the respective terminals 32, 34, 36 and 38 are essentially transferred to the respective gate electrodes of the field effect transistor switch resistors 12, 14, 16 and 18.

Using the aforementioned exemplary logic in which a digital "0" is represented by a voltage of zero volts and a digital "1" by a voltage of −7, when a digital "0" is applied to input terminal 32, 34, 36 or 38, the next gating pulse at terminal 40 will cause a voltage of essentially zero volts to be applied to the gate electrode of the associated field effect transistor switch resistor 12, 14, 16, or 18. The source-drain path of this switch resistor will be nonconductive of current, and the switch resistor will be effectively electrically disconnected from the conductors 6 and 8 of the ladder network 10. On the other hand, when a digital "1" is present at an input terminal 32, 34, 36 or 38, the next gating pulse applied to terminal 40 will cause a voltage of essentially −7 volts to be applied to the gate electrode of the associated field effect transistor switch resistor 12, 14, 16 or 18. This voltage will render the switch resistor conductive, and current will flow through its source-drain path to effectively electrically connect the switch resistor in question between the ladder network conductors 6 and 8.

Thus, when the digital input number to be converted into an analog signal is a zero i.e., digital "0"'s are applied to each of the terminals 32, 34, 36 and 38), all of the switch resistors 12, 14, 16 and 18 will be nonconductive. No current will flow in conductor 8, and the voltage at output terminal 52 will reside at its minimum level.

When a digital "1" is applied to the most significant bit input terminal 32 and digital "0"'s are applied to the remaining bit input terminals 34, 36 and 38, only the first switch resistor 12 will be rendered conductive by the gating pulse. Current of a magnitude essentially equal to $V_b/R$ will flow in the conductor 8, and a corresponding voltage will appear at output terminal 52.

When a digital "1" is present at the second most significant bit input terminal 34 and digital "0"'s are present at the remaining input terminals 32, 36 and 38, only switch resistor 14 will be rendered conductive by the gating pulse, Current of a magnitude essentially equal to $V_b/2R$ will flow in conductor 8, and a corresponding voltage will be provided at output terminal 52. Thus, the presence of a "1" at input terminal 34 results in the generation of analog current of a magnitude of half that generated when 1 a 1" was present at input terminal 32, and accurate digital-to-analog conversion is achieved since the digital bit associated with input terminal 34 has a weighted value half that of the bit associated with input terminal 32.

As further examples, when a digital "1" is present at input terminal 36 and "0"'s are present at the remaining input terminals 32, 34 and 38, current of a magnitude essentially equal to $V_b/4R$ is generated in conductor 8; and when a digital "1" is present at input terminal 38 with "0 " 's appearing at the remaining input terminals 32, 34 and 36, current of a magnitude essentially equal to $V_b\ /2^{(n-1)}R$ is generated. When digital "1"'s are present at input terminals 32 and 34, and "0" 's are present at input terminals 36 and 38, switch resistors 12 and 14 will both be conductive, and current of a magnitude essentially equal to $3V_b/2R$ will flow in conductor 8. Thus, an analog current is generated in conductor 8 (and a corresponding analog voltage is provided at output terminal 52) which is proportional to the numerical value of the digital word applied to input terminals 32, 34, 36 and 38.

All of the field effect transistor switch resistors 12, 14, 16 and 18; all of the gating field effect transistors 22, 24, 26 and 28; and the interconnecting leads may be fabricated on a single semiconductor substrate using MOS (metal-oxide-semiconductor) technology. Thus, the present invention is able to provide digital-to-analog converters of extremely small size and weight. Moreover, digital-to-analog converters according to the invention are not only simple in design, but also are highly insensitive to side variations in temperature.

Although the present invention has been shown and described with reference to a particular embodiment, nevertheless various changes and modifications obvious to a person skilled in the art to which the invention pertains are deemed to lie within the purview of the invention.

What is claimed is:

1. A digital-to-analog converter comprising:

a plurality of field effect transistor switch resistors, each having a current path and a control electrode and providing a capacitance therebetween, the respective current paths of said switch resistors being connected in parallel; one of said switch resistors being conductive of current such that a resistance R is provided in its current path when a voltage at a first preselected level is applied to its control electrode; each other of said switch resistors being conductive of current such that a different resistance related to the said resistance R in accordance with a preselected mathematical relationship is provided in its current path when a voltage essentially at said first preselected level is applied to its control electrode; each said switch resistor being essentially nonconductive of current when a voltage essentially at a uniform second preselected level is applied to its control electrode;

gating means responsive to digital input signals and a series of gating pulses and, upon receipt of a gating pulse, for selectively applying to the respective control electrodes of said switch resistors a voltage at essentially either said first or said second preselected level as determined by the digital input signals, each said capacitance being of a value to substantially maintain said first voltage level at the associated control electrode until receipt of the next gating pulse; and output means coupled to the current paths of said switch resistors for providing an analog signal representative of the net current flow through said current paths.

2. A digital-to-analog converter according to claim 1 where each of said other field effect transistor switch resistors has a channel width-to-length ratio inversely related to that of said one switch resistor in accordance with said preselected mathematical relationship.

3. A digital-to-analog converter comprising:

a plurality of field effect transistor switch resistors, each having a current path and a control electrode and providing a capacitance therebetween, the respective current paths of said switch resistors being connected in parallel; each said switch resistor being conductive of current such that a resistance $R_n=2^{(n-1)}R$ is provided in its current path when a voltage essentially at a uniform first preselected level is applied to its control electrode, where R is a predetermined resistance and n is a positive integer identifying the switch resistor in question; each said switch resistor being essentially nonconductive of current when a voltage essentially at a uniform second preselected level is applied to its control electrode;

gating means responsive to digital input signals and a series of gating pulses and, upon receipt of a gating pulse, for selectively applying to the respective control electrodes of said switch resistors a voltage at essentially either said first or said second preselected level as determined by the digital input signals, each said capacitance being of a value to substantially maintain said first voltage level at the associated control electrode until receipt of the next gating pulse; and output means coupled to the current paths of said switch resistors for providing an analog signal representative of the new current flow through said current paths.

4. A digital-to-analog converter according to claim 3 wherein each said field effect transistor switch resistor identified by an integer *n* greater than one has a channel width-to-length ratio essentially equal to $\frac{1}{2}^{(n-1)}$ that of the switch resistor identified by the integer one.

* * * * *

PO-1050
(5/69)

UNITED STATES PATENT OFFICE
CERTIFICATE OF CORRECTION

Patent No. 3,646,587 Dated February 29, 1972

Inventor(s) Everett L. Shaffstall et al

It is certified that error appears in the above-identified patent and that said Letters Patent are hereby corrected as shown below:

Col. 1, line 46, "it" should be --at--.
Col. 2, line 32, "biases" should be --biased--;
Col. 2, line 47, "with" should be --within--
Col. 2, line 67, "words" should be --word--.
Col. 3, line 40, after "50" insert --(--;
Col. 3, line 46, after "voltage", insert --of -7 volts (the aforementioned exemplary voltage--.
Col. 4, line 8, after "zero" insert --(--;
Col. 4, line 29, "1 a 1" should be --a "1"--;
Col. 4, line 58, "side" should be --wide--.
Col. 6, line 21, "new" should be --net--.

Signed and sealed this 27th day of February 1973.

(SEAL)
Attest:

EDWARD M.FLETCHER,JR.
Attesting Officer

ROBERT GOTTSCHALK
Commissioner of Patents